United States Patent
Haberstroh et al.

(10) Patent No.: US 11,137,428 B2
(45) Date of Patent: Oct. 5, 2021

(54) INTERLEAVED ACQUISITION SYSTEM, SINGLE-HOUSE DEVICE AS WELL AS METHOD OF ACQUIRING A HIGH BANDWIDTH INPUT SIGNAL

(71) Applicant: Rohde & Schwarz GmbH & Co. KG, Munich (DE)

(72) Inventors: Felix Haberstroh, Munich (DE); Nico Toender, Munich (DE); Julian Zinsser, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 89 days.

(21) Appl. No.: 16/457,547

(22) Filed: Jun. 28, 2019

(65) Prior Publication Data
US 2020/0408820 A1    Dec. 31, 2020

(51) Int. Cl.
*G01R 23/16*    (2006.01)
(52) U.S. Cl.
CPC .................................. *G01R 23/16* (2013.01)
(58) Field of Classification Search
None
See application file for complete search history.

(56) References Cited

U.S. PATENT DOCUMENTS

| | | | |
|---|---|---|---|
| 2004/0128076 A1* | 7/2004 | Pupalaikis | G01R 19/2509 702/16 |
| 2006/0080065 A1* | 4/2006 | Pupalaikis | G01R 13/0272 702/189 |
| 2012/0310601 A1* | 12/2012 | Martin | H03H 17/0621 702/190 |
| 2013/0060527 A1* | 3/2013 | Martin | G01R 13/0254 702/189 |
| 2017/0254835 A1* | 9/2017 | Montijo | G01R 13/0254 |

* cited by examiner

*Primary Examiner* — Nasima Monsur
(74) *Attorney, Agent, or Firm* — Christensen O'Connor Johnson Kindness PLLC

(57) ABSTRACT

An acquisition system includes a first acquisition and quantizer unit, a second acquisition and quantizer unit as well as a trigger unit. The first and second acquisition and quantizer units are configured to receive a respective interleaved digitized input signal, to acquire the respective interleaved digitized input signal, to quantize the respective interleaved digitized input signal, and to output a respective quantized interleaved digitized input signal. The trigger unit is configured to receive the respective quantized interleaved digitized input signals from the first and second acquisition and quantizer units. The trigger unit is further configured to de-interleave the respective quantized interleaved digitized input signals. The trigger unit is configured to generate a de-interleaved quantized digitized input signal. The trigger unit is also configured to detect an event in the de-interleaved quantized digitized input signal. Further, a method of acquiring a high bandwidth input signal is described.

15 Claims, 1 Drawing Sheet

INTERLEAVED ACQUISITION SYSTEM, SINGLE-HOUSE DEVICE AS WELL AS METHOD OF ACQUIRING A HIGH BANDWIDTH INPUT SIGNAL

FIELD OF THE DISCLOSURE

Embodiments of the present disclosure relate generally to an interleaved acquisition system for acquiring a high bandwidth input signal. Further, embodiments of the present disclosure relate generally to a single-housed device as well as a method of acquiring a high bandwidth input signal.

BACKGROUND

In measurement devices such as oscilloscopes or spectrum analyzers, an input signal is sampled in order to obtain sampled values of the input signal, which are digitized, quantized and acquired. Then, the input signal can be reconstructed as an image, also called trace, on a display of the measurement device by reading and processing the acquired values.

The acquired values and the trace related thereto is typically displayed only in parts, as only those portions are displayed that are in a defined relationship to a detected event in the input signal, for instance a rising edge or a falling edge of the input signal. The detected event is also called trigger event or just trigger. When the trigger event detected is a condition of the input signal itself, the event is called internal trigger event. When the trigger event detected is a condition outside of the input signal that has relationship to the input signal measured, such as another signal, the event is called external trigger event. However, a subset of the acquired data, namely the acquired values, is displayed in response to a detected trigger in order to allow zooming of the trace.

In US 2017/0254835 A1, a measurement system is shown that comprises several channels via which the input signal is processed be several channels in an interleaved manner in order to enable the measurement system to operate at the full signal bandwidth. Each of the channels has its own trigger processor that is configured to perform a trigger detection on the respective signal processed by the associated channel. Hence, each trigger processor takes the respective signal into account, which is processed by the associated channel.

However, each of the respective trigger processors only processes the under-sampled signal in the associated channel such that triggering is done with respect to the individual signals. Put differently, the measurement system is not able to consider the entire bandwidth of the input signal with respect to the triggering.

Accordingly, there is a need for a possibility to trigger on an input signal without any limitation concerning the bandwidth.

SUMMARY

Embodiments of the present disclosure provide an interleaved acquisition system for acquiring a high bandwidth input signal. The interleaved acquisition system comprises a first acquisition and quantizer unit, a second acquisition and quantizer unit as well as a trigger unit.

The first acquisition and quantizer unit is configured to receive a first interleaved digitized input signal, to acquire the first interleaved digitized input signal, to quantize the first interleaved digitized input signal, and to output a first quantized interleaved digitized input signal.

The second acquisition and quantizer unit is configured to receive a second interleaved digitized input signal, to acquire the second interleaved digitized input signal, to quantize the second interleaved digitized input signal, and to output a second quantized interleaved digitized input signal.

The trigger unit is configured to receive the first quantized interleaved digitized input signal from the first acquisition and quantizer unit as well as the second quantized interleaved digitized input signal from the second acquisition and quantizer unit. The trigger unit is configured to de-interleave the first quantized interleaved digitized input signal and the second quantized interleaved digitized input signal. The trigger unit is further configured to generate a de-interleaved quantized digitized input signal based on the first quantized interleaved digitized input signal and the second quantized interleaved digitized input signal. The trigger unit is configured to detect an event in the de-interleaved quantized digitized input signal.

Further, embodiments of the present disclosure provide a method of acquiring a high bandwidth input signal, with the following steps:

receiving a first interleaved digitized input signal via a first acquisition and quantizer unit;

acquiring the first interleaved digitized input signal via the first acquisition and quantizer unit;

quantizing the first interleaved digitized input signal via the first acquisition and quantizer unit;

outputting a first quantized interleaved digitized input signal via the first acquisition and quantizer unit;

receiving a second interleaved digitized input signal via a second acquisition and quantizer unit;

acquiring the second interleaved digitized input signal via the second acquisition and quantizer unit;

quantizing the second interleaved digitized input signal via the second acquisition and quantizer unit;

outputting a second quantized interleaved digitized input signal via the second acquisition and quantizer unit;

receiving, via a trigger unit, the first quantized interleaved digitized input signal and the second quantized interleaved digitized input signal;

de-interleaving, via the trigger unit, the first quantized interleaved digitized input signal and second quantized interleaved digitized input signal;

generating, via the trigger unit, a de-interleaved quantized digitized input signal based on the first quantized interleaved digitized input signal and second quantized interleaved digitized input signal; and detecting, via the trigger unit, an event in the de-interleaved quantized digitized input signal.

Accordingly, the embodiments of the present disclosure collect the data gathered by each of the acquisition and quantizer units by means of the common trigger unit. The trigger unit de-interleaves the respective quantized interleaved digitized input signals processed by the acquisition and quantizer units such that the de-interleaved quantized digitized input signal is obtained, allowing to take hysteresis of the input signal into account.

In other words, the data provided by each individual acquisition and quantizer unit is collected by the trigger unit. The respective quantized interleaved digitized input signals of each acquisition and quantizer unit are forwarded to the trigger unit, which receives the respective quantized interleaved digitized input signals rather than output data of a trigger processor only indicating a trigger event in the under-sampled signal processed by the respective channel.

The interleaved acquisition system according to the present disclosure allows to trigger on the input signal without any band limitation while simultaneously not discarding any signal edges in the input signal, as the quantized interleaved digitized input signals are de-interleaved by the trigger system prior to applying the respective trigger condition. Put differently, the trigger condition is applied on the de-interleaved quantized digitized input signal obtained after de-interleaving the quantized interleaved digitized input signals.

As the quantized interleaved digitized input signals are de-interleaved, it is ensured that no edges are discarded.

In general, the input is signal is quantized in a distributed manner by the channels, namely the interleaved paths comprising the respective interleaved acquisition and quantizer units.

The quantized input signals are combined by the trigger unit while de-interleaving the quantized interleaved digitized input signals so as to generate the de-interleaved quantized digitized input signal on which the trigger condition is applied. Thus, no edges in the input signal are discarded.

According to an aspect, the first quantized interleaved digitized input signal and the second quantized interleaved digitized input signal are directly forwarded to the trigger unit in parallel. Thus, the respective quantized interleaved digitized input signals are not pre-processed by any other component of the interleaved acquisition system, as the quantized interleaved digitized input signals are directly forwarded to the trigger unit.

Another aspect provides that at least one of the first acquisition and quantizer unit and the second acquisition and quantizer unit is configured to quantize by at least one threshold. The threshold applied by the first acquisition and quantizer unit and/or the second acquisition and quantizer unit relates to a quantization level. This means that the threshold relates to a level by which some least significant bits are dismissed.

In fact, the amount of data to be processed can be reduced by quantizing the amplitude of a high resolution interleaved digitized input signal to a lower quantized interleaved digitized input signal. For instance, a 12-bit interleaved digitized input signal is reduced to a 2-bit quantized interleaved digitized input signal by applying the respective threshold.

Generally, the at least one threshold may be set. In other words, the quantization level can be set or rather programmed in a desired manner.

Moreover, at least one of the first acquisition and quantizer unit and the second acquisition and quantizer unit may be configured to quantize by at least two thresholds. Thus, different states can be quantized in an appropriate manner, which depends on the type of signal. For instance, a PAM-n signal is used.

Generally, the number of different thresholds may also enable different and complex trigger scenarios to be applied on the input signal.

The trigger scenarios may relate to different channels, as their respective quantized interleaved digitized input signals are forwarded to the trigger unit for triggering purposes, wherein they are de-interleaved previously.

For instance, the trigger scenario is applied on the interleaved quantized digitized input signal at the end of the signal processing chain. Hence, modification or rather extensions can be integrated easily, as they have no influence on the previous signal processing components.

In some embodiments, the at least two thresholds are not equidistant. This means that the distance between the at least two thresholds are different. In other words, the first threshold has a first distance to a base line that is different to the distance of the second threshold to the first threshold. Hence, the thresholds are not equidistant.

If more than two thresholds are provided, the different thresholds may have different distances to their direct neighbors yielding not equidistant thresholds. Accordingly, different trigger scenarios can be set freely.

Another aspect provides the trigger unit is implemented on a separate chip or circuit with respect to at least one of the first acquisition and quantizer unit and the second acquisition and quantizer unit. In other words, the trigger unit is implemented on a dedicated chip that is separately formed with respect to the acquisition and quantizer units.

The trigger unit may be implemented on a single chip. This means that the trigger unit is provided on a single chip rather than on several different chips affined to the acquisition and quantizer units.

As mentioned above, the trigger unit may relate to the last component of the signal processing chain, as the acquisition and quantizer units are located upstream. By implementing the trigger unit on a separate chip, the trigger unit can be exchanged easily if necessary.

In addition, the first acquisition and quantizer unit may be implemented on a separate chip with respect to the second acquisition and quantizer unit. Thus, all components of the interleaved acquisition system may be established on their own single chip.

Put differently, the first acquisition and quantizer unit is implemented on a first chip, the second acquisition and quantizer unit is implemented on a second chip and the trigger unit is implemented on a third chip, wherein these three chips are separately formed with respect to each other.

The respective chips may be implemented by an application-specific integrated circuit (ASIC) or rather a field-programmable gate array (FPGA). Other analog and/or digital circuits, programmed processors, etc., may also be employed with embodiments of the present disclosure.

According to another aspect, the first acquisition and quantizer unit and the second acquisition and quantizer unit are assigned to separate channels. The interleaved acquisition system may comprise several channels, namely at least two channels, wherein each channel is assigned to an acquisition and quantizer unit so that broadband input signals can be acquired by the interleaved acquisition system in an appropriate manner. As discussed above, the trigger condition is also applied on the entire broadband input signal, namely without any limitation concerning the bandwidth.

Furthermore, the interleaved acquisition system may be implemented in a single-housed device. Thus, all components of the interleaved acquisition system are housed in a common housing.

For instance, the single-housed device is an oscilloscope or a spectrum analyzer. In other words, the interleaved acquisition system may be assigned to a measurement device having a single housing that encompasses all components of the interleaved acquisition system.

Accordingly, embodiments of the present disclosure also provide a single-housed device, for instance a measurement device, that comprises the interleaved acquisition system as described above. This single-housed device may be an oscilloscope or a spectrum analyzer.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
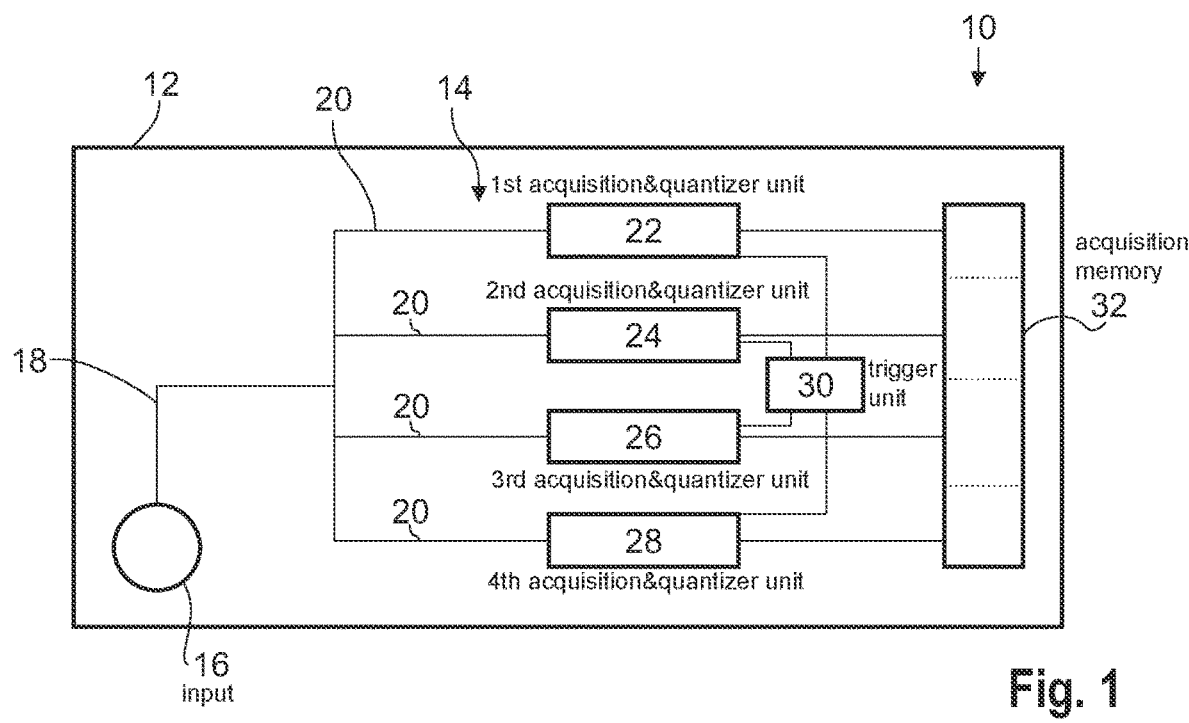
FIG. 1 shows a schematic overview of a single-housed device according to the present disclosure, which comprises an interleaved acquisition system according to the present disclosure.

In FIG. 1, a single-housed device 10 is shown that is a measurement device. For instance, the single-housed device 10 relates to an oscilloscope or a spectrum analyzer. The single-housed device 10 has a housing 12 that encompasses an interleaved acquisition system 14 that is assigned to an input 16 of the single-housed device 10, which is located at a front end of the device 10.

The single-housed device 10 and, therefore, the interleaved acquisition system 14 receives an input signal, namely a high bandwidth input signal, via the input 16, wherein the input signal is processed internally by the interleaved acquisition system 14. The high bandwidth input signal may have a frequency between 0 and 128 GHz.

In the shown embodiment, the input 16 is assigned to an analog channel 18 with a sample rate of 320 GSamples/s and a resolution of 12 bit. The analog channel 18 is connected with four channels 20 for acquiring the high bandwidth input signal in an interleaved manner. This means that each channel 20 receives every fourth sample.

Put differently, the first channel 20 receives the samples with the indices 0, 4, 8 and so on, whereas the second channel 20 receives the samples with the indices 1, 5, 9 and so on. In a similar manner, the third channel 20 receives the samples with the indices 2, 6, 10 and so on, whereas the fourth channel 20 receives the samples with the indices 3, 7, 11 and so on.

Therefore, the interleaved acquisition system 14 comprises a first acquisition and quantizer unit 22, a second acquisition and quantizer unit 24, a third acquisition and quantizer unit 26, a fourth acquisition and quantizer unit 28 as well as a trigger unit 30 connected with all acquisition and quantizer units 22-28.

As shown in FIG. 1, each of the four channels 20 has a sample rate of 80 GSamples/s and a resolution of 12 bit resulting in under-sampled signals processed by the respective acquisition and quantizer units 22-28.

The first acquisition and quantizer unit 22 is assigned to an acquisition memory 32. The other acquisition and quantizer units 24-28 may be assigned to the same acquisition memory 32 or rather a separate one. In other words, each of the channels 20 may be assigned to their own acquisition memory or the channels 20 are assigned to the common acquisition memory 32 that is internally divided in memory portions.

As shown in FIG. 1, each of the acquisition and quantizer units 22-28 is connected with the trigger unit 30 so that data outputted by the respective acquisition and quantizer unit 22-28 is directly forwarded to the trigger unit 30.

For instance, quantized data streams with 1 to 3 bits may be outputted by the respective acquisition and quantizer units 22-28.

Generally, the trigger unit 30 is implemented on a single separate chip with respect to the acquisition and quantizer units 22-28. Each of the acquisition and quantizer units 22-28 is also implemented on a separate own chip. This means that the acquisition and quantizer units 22-28 are each implemented on a separate chip with respect to the other ones.

The chips may be established by an application-specific integrated circuit (ASIC) or rather a field-programmable gate array (FPGA). Other analog and/or digital circuits, programmed processors, etc., may also be used.

In fact, the trigger unit 30, particularly its chip, may be located in a middle, wherein the other chips associated with the acquisition and quantizer units 22-28 surround the chip assigned to the trigger unit 30, for instance in a star-shaped manner.

Figure 3:
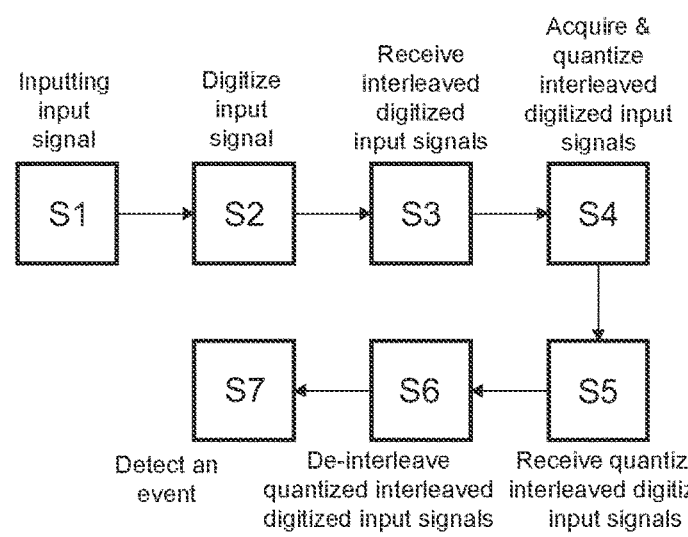
FIG. 3 shows a flow-chart illustrating a method of acquiring a high bandwidth input signal according to the present disclosure.

In the following, the functionality of the interleaved acquisition system 14 is described in more detail with reference to FIG. 3.

In a first step S1, the high bandwidth input signal is inputted via the input 16 located at the front end of the single-housed device 10, wherein the input signal may be split into four interleaved input signals.

In a second step S2, the interleaved input signals may be digitized in order generate interleaved digitized input signals.

Alternatively, the input signal may be digitized prior to interleaving the input signal.

In any case, the high bandwidth input signal is converted into a plurality of interleaved data streams, namely the interleaved digitized input signals, which are forwarded to the respective acquisition and quantizer units 22-28 that receive the respective interleaved digitized input signals in a third step S3.

In a fourth step S4, the interleaved digitized input signals are acquired and quantized by the respective acquisition and quantizer unit 22-28 so that a respective quantized interleaved digitized input signal is outputted by the respective acquisition and quantizer unit 22-28, namely first, second, third and fourth quantized interleaved digitized input signals by the respective acquisition and quantizer unit 22-28.

As shown in FIG. 1, the quantized interleaved digitized input signals outputted by the respective acquisition and quantizer unit 22-28 are each forwarded to the trigger unit 30. Hence, the trigger unit 30 receives the quantized interleaved digitized input signals from the respective acquisition and quantizer units 22-28 in a fifth step S5. In the shown example, each of the outputted quantized interleaved digitized input signals may have a data rate of 160 Gbps, namely 80 GSamples/s a 2 Bit=80 Ghz*2=160 Gbps.

Thus, the trigger unit 30 receives signals with a data of 640 Gbps as four channels 20 are provided for transmitting the respective quantized interleaved digitized input signals.

In a sixth step S6, the trigger unit 30 de-interleaves the respective quantized interleaved digitized input signals in order to generate a de-interleaved quantized digitized input signal. This de-interleaved quantized digitized input signal is based on the respective quantized interleaved digitized input signals.

In a seventh step S7, the trigger unit 30 detects an event, namely a trigger event, in the de-interleaved quantized digitized input signal generated by the trigger unit 30 itself based on the quantized interleaved digitized input signals received from the acquisition and quantizer units 22-28.

In other words, the quantized interleaved digitized input signals are directly forwarded to the trigger unit 30, namely in parallel.

However, the quantized interleaved digitized input signals are de-interleaved prior to applying the respective trigger condition. Thus, it is ensured that no limitation with regard to the bandwidth occurs. In addition, no edges are discarded for triggering purposes.

If a trigger event is detected, namely a trigger condition met, the trigger unit 30 outputs the respective trigger information.

In addition, complex trigger scenarios can be applied, as the trigger scenarios may relate on channel combination(s).

Figure 2:
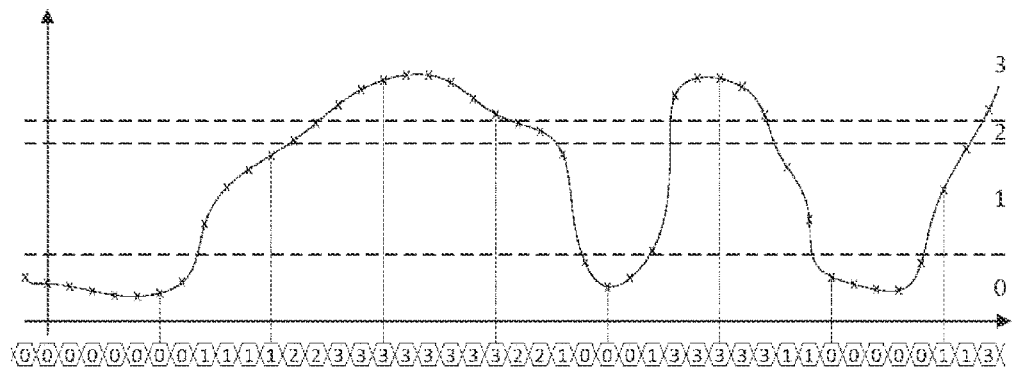
FIG. 2 shows an example of a trigger scenario applied.

Moreover, the thresholds for the quantification may be set freely, as illustrated in FIG. 2, which shows that the acquisition and quantizer units 22-28 may quantize the respective interleaved digitized input signal by three different thresholds that are not equidistant with respect to each other. Thus, two bits per analog sample are used, as shown in FIG. 2.

As the trigger unit 30 receives the quantized interleaved digitized input signals from the acquisition and quantizer units 22-28, it is ensured that input signal hysteresis is taken into account by the trigger unit 30, as the trigger unit 30 receives all quantized analog samples.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. An interleaved acquisition system for acquiring a high bandwidth input signal, comprising a first acquisition and quantizer circuit, a second acquisition and quantizer circuit, and a trigger circuit, said first acquisition and quantizer circuit being configured to receive a first interleaved digitized input signal, said first acquisition and quantizer circuit being configured to acquire said first interleaved digitized input signal, said first acquisition and quantizer circuit being configured to quantize said first interleaved digitized input signal, and said first acquisition and quantizer circuit being configured to output a first quantized interleaved digitized input signal;

said second acquisition and quantizer circuit being configured to receive a second interleaved digitized input signal, said second acquisition and quantizer circuit being configured to acquire said second interleaved digitized input signal, said second acquisition and quantizer circuit being configured to quantize said second interleaved digitized input signal, and said second acquisition and quantizer circuit being configured to output a second quantized interleaved digitized input signal; and said trigger circuit being configured to receive said first quantized interleaved digitized input signal from said first acquisition and quantizer circuit, said trigger circuit being configured to receive said second quantized interleaved digitized input signal from said second acquisition and quantizer circuit, said first quantized interleaved digitized input signal and said second quantized interleaved digitized input signal being directly forwarded to said trigger circuit in parallel, and said trigger circuit being configured to de-interleave said first quantized interleaved digitized input signal and said second quantized interleaved digitized input signal, said trigger circuit being configured to combine directly said first quantized interleaved digitized input signal and said second quantized interleaved digitized input signal, thereby generating a de-interleaved quantized digitized input signal based on said first quantized interleaved digitized input signal and said second quantized interleaved digitized input signal, and said trigger circuit being configured to detect an event in said de-interleaved quantized digitized input signal.

2. The interleaved acquisition system according to claim 1, wherein at least one of said first acquisition and quantizer circuit and said second acquisition and quantizer circuit is configured to quantize by at least one threshold.

3. The interleaved acquisition system according to claim 1, wherein at least one of said first acquisition and quantizer circuit and said second acquisition and quantizer circuit is configured to quantize by at least two thresholds.

4. The interleaved acquisition system according to claim 3, wherein said at least two thresholds are not equidistant.

5. The interleaved acquisition system according to claim 1, wherein said trigger circuit is implemented on a separate chip with respect to at least one of said first acquisition and quantizer circuit and said second acquisition and quantizer circuit.

6. The interleaved acquisition system according to claim 1, wherein said first acquisition and quantizer circuit is implemented on a separate chip with respect to said second acquisition and quantizer circuit.

7. The interleaved acquisition system according to claim 1, wherein said first acquisition and quantizer circuit and said second acquisition and quantizer circuit are assigned to separate channels.

8. The interleaved acquisition system according to claim 1, wherein said interleaved acquisition system is implemented in a single-housed device.

9. The interleaved acquisition system according to claim 8, wherein said single-housed device is an oscilloscope or a spectrum analyzer.

10. A single-housed device comprising the interleaved acquisition system according to claim 1.

11. A method of acquiring a high bandwidth input signal, comprising:
receiving a first interleaved digitized input signal via a first acquisition and quantizer circuit implemented on a first chip;
acquiring said first interleaved digitized input signal via said first acquisition and quantizer circuit;
quantizing said first interleaved digitized input signal via said first acquisition and quantizer circuit;
outputting a first quantized interleaved digitized input signal via said first acquisition and quantizer circuit;
receiving a second interleaved digitized input signal via a second acquisition and quantizer circuit implemented on a second chip;
acquiring said second interleaved digitized input signal via said second acquisition and quantizer circuit;
quantizing said second interleaved digitized input signal via said second acquisition and quantizer circuit;
outputting a second quantized interleaved digitized input signal via said second acquisition and quantizer circuit;
receiving, via a trigger circuit implemented on a separate chip with respect to the first chip and said second chip, said first quantized interleaved digitized input signal and said second quantized interleaved digitized input signal, wherein said first quantized interleaved digitized input signal and said second quantized interleaved digitized input signal are directly forwarded to said trigger circuit in parallel;
de-interleaving, via said trigger circuit, said first quantized interleaved digitized input signal and second quantized interleaved digitized input signal;
generating, via said trigger circuit, a de-interleaved quantized digitized input signal based on said first quantized interleaved digitized input signal and second quantized interleaved digitized input signal; and
detecting, via said trigger circuit, an event in said de-interleaved quantized digitized input signal.

12. The method according to claim 11, wherein at least one of said first acquisition and quantizer circuit and said second acquisition and quantizer circuit quantizes by at least one threshold.

13. The method according to claim 11, wherein at least one of said first acquisition and quantizer circuit and said second acquisition and quantizer circuit quantizes by at least two thresholds.

14. The method according to claim 13, wherein said at least two thresholds are not equidistant.

15. An interleaved acquisition system for acquiring a high bandwidth input signal, comprising a first acquisition and quantizer circuit, a second acquisition and quantizer circuit, and a trigger circuit,
said first acquisition and quantizer circuit is implemented on a first chip and said second acquisition and quantizer circuit is implemented on a second chip;
said trigger circuit being implemented on a separate chip with respect to said first acquisition and quantizer circuit and said second acquisition and quantizer circuit;
said first acquisition and quantizer circuit being configured to receive a first interleaved digitized input signal, said first acquisition and quantizer circuit being configured to acquire said first interleaved digitized input signal, said first acquisition and quantizer circuit being configured to quantize said first interleaved digitized input signal, and said first acquisition and quantizer circuit being configured to output a first quantized interleaved digitized input signal;
said second acquisition and quantizer circuit being configured to receive a second interleaved digitized input signal, said second acquisition and quantizer circuit being configured to acquire said second interleaved digitized input signal, said second acquisition and quantizer circuit being configured to quantize said second interleaved digitized input signal, and said second acquisition and quantizer circuit being configured to output a second quantized interleaved digitized input signal; and
said trigger circuit being configured to receive said first quantized interleaved digitized input signal from said first acquisition and quantizer circuit, said trigger circuit being configured to receive said second quantized interleaved digitized input signal from said second acquisition and quantizer circuit,
said trigger circuit being configured to combine said quantized input signals, thereby de-interleaving said first quantized interleaved digitized input signal and said second quantized interleaved digitized input signal, said trigger circuit being configured to generate a de-interleaved quantized digitized input signal based on said first quantized interleaved digitized input signal and said second quantized interleaved digitized input signal, and said trigger circuit being configured to detect an event in said de-interleaved quantized digitized input signal.

* * * * *